United States Patent
Torii

(10) Patent No.: US 9,117,872 B2
(45) Date of Patent: Aug. 25, 2015

(54) SEMICONDUCTOR DEVICE AND METHOD FOR MANUFACTURING THE SEMICONDUCTOR DEVICE

(71) Applicant: Sanken Electric Co., Ltd., Niiza-shi, Saitama (JP)

(72) Inventor: Katsuyuki Torii, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 14/037,549

(22) Filed: Sep. 26, 2013

(65) Prior Publication Data

US 2014/0097466 A1    Apr. 10, 2014

(30) Foreign Application Priority Data

Oct. 4, 2012    (JP) ................ 2012-222221

(51) Int. Cl.
*H01L 29/66*     (2006.01)
*H01L 29/739*    (2006.01)
*H01L 29/10*     (2006.01)

(52) U.S. Cl.
CPC ........ *H01L 29/7395* (2013.01); *H01L 29/1095* (2013.01); *H01L 29/66325* (2013.01); *H01L 29/66348* (2013.01); *H01L 29/7393* (2013.01); *H01L 29/7397* (2013.01)

(58) Field of Classification Search
None
See application file for complete search history.

(56) References Cited

U.S. PATENT DOCUMENTS

| 5,981,344 | A  | * | 11/1999 | Hshieh et al. | 438/270 |
| 6,262,470 | B1 | * | 7/2001  | Lee et al.    | 257/565 |
| 6,661,054 | B1 | * | 12/2003 | Nakamura      | 257/330 |
| 2008/0012040 | A1 | * | 1/2008 | Saito et al. | 257/133 |
| 2008/0251810 | A1 | * | 10/2008 | Torii | 257/139 |

FOREIGN PATENT DOCUMENTS

JP    H8-316479 A    11/1996

* cited by examiner

*Primary Examiner* — Evan Pert
*Assistant Examiner* — Herve Assouman
(74) *Attorney, Agent, or Firm* — Marvin A. Motsenbocker; Mots Law, PLLC

(57) ABSTRACT

A semiconductor device includes a p-type collector region, a drift region arranged on the collector region, a base region arranged on the drift region, an emitter region arranged on the base region, a gate oxide film arranged on the bottom surface and side surface of a trench which penetrates the emitter region and the base region, and a gate electrode embedded in the inside of the trench so as to be opposed to the base region while interposing the gate oxide film therebetween, wherein the position of the lower surface of the base region is shallower in the region brought into contact with the gate oxide film than in the region spaced apart from the gate oxide film.

7 Claims, 5 Drawing Sheets

SEMICONDUCTOR DEVICE AND METHOD FOR MANUFACTURING THE SEMICONDUCTOR DEVICE

CROSS REFERENCE TO RELATED APPLICATIONS AND INCORPORATION BY REFERENCE

This application is based upon and claims the benefit of priority from prior Japanese Patent Application P2012-222221 filed on Oct. 4, 2012; the entire contents of which are incorporated by reference herein.

BACKGROUND OF THE INVENTION

1. Field of the Invention

The present invention relates to a semiconductor device having an IGBT structure and to a method for manufacturing the semiconductor device.

2. Description of the Related Art

An insulated gate bipolar transistor (IGBT) has a high input impedance and a low ON voltage, and accordingly, is used for a motor drive circuit and the like. However, in the IGBT, the withstand voltage and the ON voltage have a trade-off relationship.

Therefore, a variety of methods are proposed in order to reduce the ON voltage while maintaining a high withstand voltage. For example, a method of forming a carrier accumulation layer between a base region and a drift region is proposed. It is disclosed that, in accordance with this structure, carriers are accumulated in the vicinity of the interface between the carrier accumulation layer and the drift region, and the ON voltage can be reduced while maintaining a relatively high withstand voltage.

However, though the ON voltage is suitably reduced, the withstand voltage is also lowered since it becomes difficult to extend the depletion layer of the carrier accumulation layer due to the fact that the impurity concentration of the carrier accumulation layer is raised. As described above, it is difficult to enhance both the withstand voltage and the ON voltage. Moreover, in a semiconductor device with such an IGBT structure, a latch-up phenomenon occurs by generation of parasitic transistors.

SUMMARY OF THE INVENTION

An aspect of the present invention inheres in a semiconductor device. The semiconductor device includes a p-type collector region; an n-type drift region arranged on the collector region; a p-type base region arranged on the drift region; an n-type emitter region arranged on the base region; a gate oxide film arranged on a bottom surface and side surface of a trench that extends from an upper surface of the emitter region and penetrates the emitter region and the base region; and a gate electrode embedded in an inside of the trench so as to be opposed to the base region while interposing the gate oxide film therebetween. The position of a lower surface of the base region is shallower in a region brought into contact with the gate oxide film than in a region spaced apart from the gate oxide film.

Another aspect of the present invention inheres in a semiconductor device. The semiconductor device includes a p-type collector region; an n-type drift region arranged on the collector region; a p-type base region arranged on the drift region; an n-type emitter region arranged on the base region; a gate oxide film arranged on a bottom surface and side surface of a trench that extends from an upper surface of the emitter region and penetrates the emitter region and the base region; and a gate electrode embedded in an inside of the trench so as to be opposed to the base region while interposing the gate oxide film therebetween. The semiconductor device has an area where an impurity concentration of the base region becomes higher as a distance from the gate oxide film becomes greater.

Still another aspect of the present invention inheres in a method for manufacturing a semiconductor device. The method includes forming a p-type base region on an n-type drift region by an impurity diffusion method or an epitaxial growth method; forming an n-type emitter region on the base region; forming a trench that extends from an upper surface of the emitter region and penetrates the emitter region and the base region; oxidizing an inner wall of the trench and forming a gate oxide film, thereby taking, into the gate oxide film, p-type impurities from an area of the base region in contact with the gate oxide film, and thereby making a position of a lower surface of the area of the base region in contact with the gate oxide film shallower than other areas; and forming a gate electrode by filling an inside of the trench with a material of the gate electrode.

DETAILED DESCRIPTION OF THE INVENTION

Figure 1:
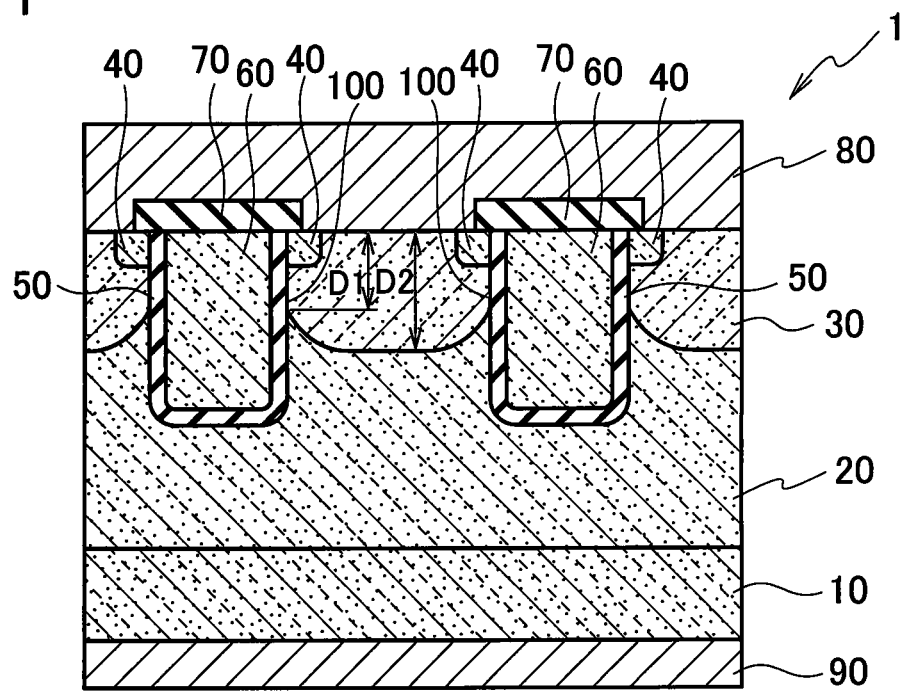
FIG. 1 is a schematic cross-sectional view showing a structure of a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values etc., to provide a thorough understanding of the present invention. However, it will be obvious to those skilled in the art that the present invention may be practiced without such specific details.

(First Embodiment)

As shown in FIG. 1, a semiconductor device 1 according to a first embodiment of the present invention includes: a p-type collector region 10; an n-type drift region 20 arranged on the collector region 10; a p-type base region 30 arranged on the drift region 20; n-type emitter regions 40 arranged on the base region 30; gate oxide films 50 arranged on bottom surfaces and side surfaces of trenches, the trenches extending from upper surfaces of the emitter regions 40 and penetrating the emitter regions 40 and the base region 30; and gate electrodes 60 embedded inside the trenches so as to be opposed to the base region 30 while interposing the gate oxide films 50 therebetween.

The semiconductor device 1 is an insulated gate bipolar transistor (IGBT), and channel regions 100 are formed where sections of the surface of the base region 30 are opposed to the gate electrodes 60. On upper surfaces of the gate electrodes 60, interlayer insulating films 70 are arranged. On the interlayer insulating films 70, an emitter electrode 80 which connects to the emitter regions 40 and the base region 30, is arranged.

As shown in FIG. 1, the base region 30 is formed so that at the interface with the drift region 20, the lower surface of the base region 30 in contact with sidewalls of the gate oxide films 50 (at a distance D1 from the upper surface of the base region 30) can be shallower than the lower surface of the base region 30 in regions spaced apart from the gate oxide films 50 (at a distance D2 from the upper surface of the base region 30). Here, there is a relationship of 1.2<D2/(D2−D1)<40. A more preferable relationship is 4<D2/(D2−D1)<10.

Note that, in the regions of the base region 30 which are brought into contact with the gate oxide films 50, the impurity concentration is lower in comparison with the regions thereof spaced apart from the gate oxide films 50, that is, regions in the central area between two gate oxide films 50. That is to say, the semiconductor device 1 has a portion where the impurity concentration of the base region 30 becomes higher as the portion concerned separates from the gate oxide films 50. In this connection, the impurity concentration of the base region 30 is approximately $5 \times 10^{16}$ to $1 \times 10^{13}$ cm$^{-3}$ at a spot where the impurity concentration is high. Note that, as the impurity concentration of the base region 30 reduces, the difference between the distance D1 and the distance D2 increases.

A description is made below of operations of the semiconductor device 1. A predetermined collector voltage is applied between the emitter electrode 80 and the collector electrode 90, and a predetermined gate voltage is applied between the emitter electrode 80 and the gate electrodes 60. For example, the collector voltage is approximately 300V to 1600 V, and the gate electrode is approximately 10V to 20V. When the semiconductor device 1 is turned to an ON state in such a way, the polarity of the channel regions 100 is inverted from the p-type to the n-type, and channels are formed there. Passing through the formed channels, electrons are emitted into the drift region 20 from the emitter electrode 80. Due to the electrons thus implanted, a forward bias is caused between the collector region 10 and the drift region 20, and holes move to the drift region 20 and then the base region 30 from the collector electrode 90 via the collector region 10. When the current is further increased, the number of holes coming from the collector region 10 increases, and the holes accumulate below the base region 30. As a result, the ON resistance is lowered by conductivity modulation.

In the case of turning the semiconductor device 1 from the ON state to the OFF state, the gate voltage is set lower than a threshold voltage, and the channel regions 100 are extinguished. For example, the gate voltage is controlled to be the same ground voltage as an emitter voltage or to be reversely biased. In such a way, such emission of the electrons from the emitter electrode 80 to the drift region 20 is stopped. The potential of the collector electrode 90 is higher than that of the emitter electrode 80, and accordingly, a depletion layer extends from the interface between the base region 30 and the drift region 20, and in addition, the holes accumulated in the drift region 20 move to the emitter electrode 80.

In the semiconductor device 1 having an IGBT structure, the ON voltage is decided by the state of the pn junction formed of the emitter regions 40 and the base region 30, and by the width and length of the channels generated in the base region 30. Regions where the channels are formed are those regions of the base region 30 which are opposed to the gate electrodes 60 while interposing the gate oxide films 50 therebetween. In the semiconductor device shown in FIG. 1, the base region 30 is formed shallower in the regions brought into contact with the gate oxide films 50 than in the region spaced apart from the gate oxide films 50, and accordingly, the channel regions 100 are short in length. Therefore, channel resistance is lowered.

Moreover, the impurity concentration in the base region 30 is low in the regions close to the gate oxide films 50, and accordingly, the channel width is easy to extend, and the channel resistance can be reduced. Hence, the ON voltage of the semiconductor device 1 can be reduced.

Incidentally, in the semiconductor device 1 with the IGBT structure, in response to the electron flow from the emitter regions 40 to the drift region 20 via the channels formed in the base region 30, the holes are implanted from the drift region 20 into the base region 30, and the holes move to the emitter regions 40. At this time, if the number of holes that move along lower surfaces and side surfaces of the emitter regions 40 is large and the distance of this movement is long, then an apparent electromotive force is generated in the base region 30, and the base region 30 and the emitter regions 40 are forward-biased. Therefore, electrons, which flow to the drift region 20 without passing via the emitter regions 40, are generated. That is to say, a latch-up phenomenon occurs in which current flows uncontrollably, and parasitic transistors generated in the emitter regions 40 and the base region 30/drift region 20 are turned ON.

However, in the semiconductor device 1 shown in FIG. 1, lower surfaces of the base region 30 have a curved shape protruding downward. Hence, the distance between the collector region 10 and the base region 30 is shorter in regions spaced apart from the gate oxide films 50; that is, regions not in the vicinity of the gate oxide films 50 and also outside and between the trenches in which the gate electrodes 60 are individually formed. As a result, the holes move through the base region 30 not in regions in the vicinity of the gate oxide films 50 but in regions spaced apart from the gate oxide films 50. Hence, the number of holes which move along the lower surfaces and side surfaces of the emitter regions 40 is suppressed. The latch-up phenomenon described above is more likely to occur when the number of holes which move along the emitter regions 40 is large and when the distance of the movement of the holes along the emitter regions 40 is long. Therefore, in the semiconductor device 1 in which the electrons move through the regions spaced apart from the emitter regions 40, the occurrence of the latch-up phenomenon can be suppressed.

As described above, in accordance with the semiconductor device 1 according to the first embodiment of the present invention, a semiconductor device can be provided in which the withstand voltage is high and the ON voltage is low and in which the occurrence of the latch-up phenomenon is suppressed.

By using FIG. 2 to FIG. 5, a description is made of a method for manufacturing the semiconductor device 1 according to the first embodiment of the present invention. Note that such a manufacturing method to be described below is merely an example, and it is a matter of course that the semiconductor device 1 is realizable by a variety of other manufacture methods including modified examples thereof.

Figure 2:
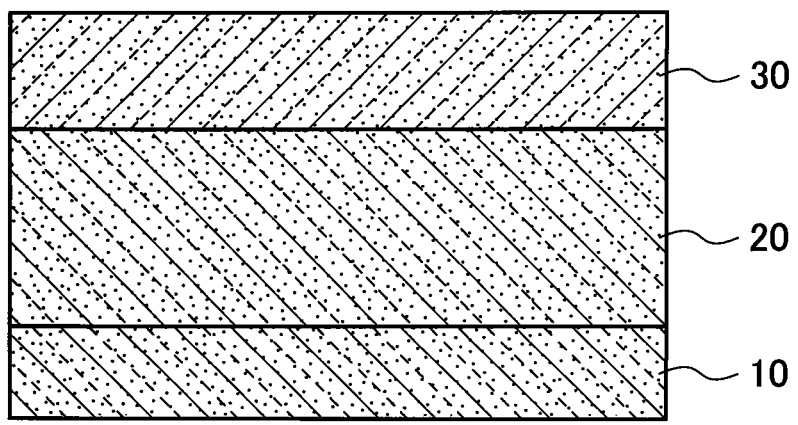
FIG. 2 to FIG. 5 are process cross-sectional views for explaining a method for manufacturing a semiconductor device according to the first embodiment of the present invention.
Figure 3:
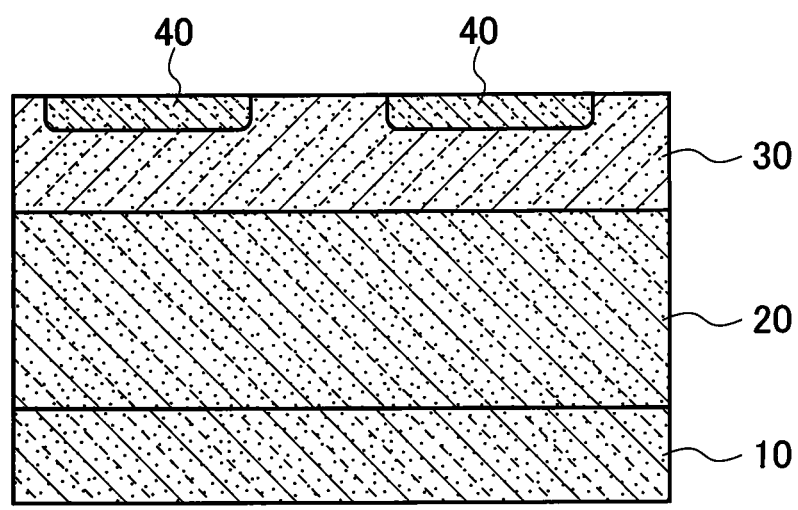

As shown in FIG. 2, on the n-type drift region 20 stacked on the p-type collector region 10, the p-type base region 30 is formed by the impurity diffusion method or the epitaxial growth method. For example, in accordance with the impurity diffusion method, p-type impurities are implanted into the drift region 20 from an upper surface thereof by the ion implantation method, and thereafter, are diffused by annealing treatment. In such a way, the base region 30 is formed with a substantially uniform thickness. The p-type impurities in the base region 30 are, for example, boron (B). Subsequently, as shown in FIG. 3, in partial portions of the upper surface of the base region 30, the n$^+$-type emitter regions 40 are formed, for example, by the ion implantation method and diffusion.

Figure 4:
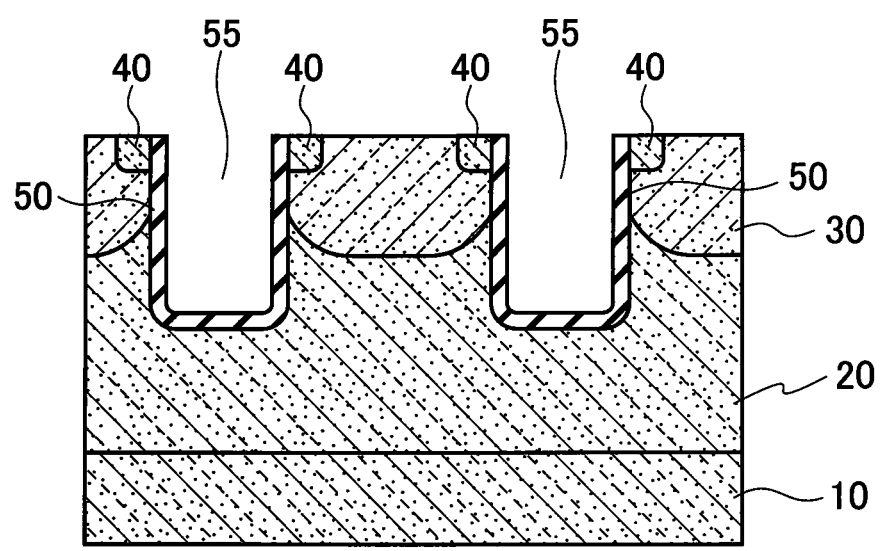

By using a mask, which is arranged on the emitter region 40 and has opening portions, trenches 55 are formed by photolithography technology and etching technology. The trenches 55 extend from the upper surfaces of the emitter regions 40 and penetrate the emitter regions 40 and the base region 30, and then tip ends of the trenches 55 reach the drift region 20. Bottom surfaces of the trenches 55 are substantially flat. Then, as shown in FIG. 4, the gate oxide films 50 are formed on inner walls of the trenches 55. For example, silicon oxide films ($SiO_2$) are formed by the thermal oxidation method.

At this time, the p-type impurities in the regions in the base region 30 which are brought into contact with the gate oxide films 50, are taken into the gate oxide films 50. Therefore, the impurity concentration of the base region 30 in the vicinities of the gate oxide films 50 becomes low. That is to say, the impurity concentration of the base region 30 becomes higher as distance from the gate oxide films 50 increases. As a result, the thickness of the base region 30 becomes thinner in the regions in the vicinities of the gate oxide films 50 than in the regions spaced apart from the gate oxide films 50.

Figure 5:
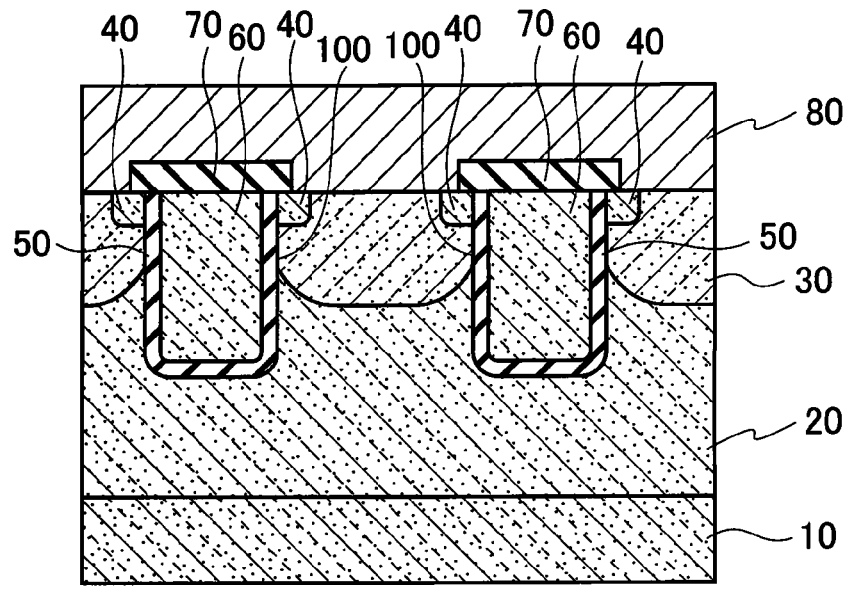

Moreover, the base region 30 formed by the impurity diffusion method is formed so that the impurity concentration therein can be lower in the region close to the lower surface thereof than in the region close to the upper surface thereof. Therefore, when the p-type impurities in the base region 30 are taken into the gate oxide films 50, the impurity concentration becomes particularly low in the regions close to the lower surface of the base region 30 and in the vicinities of the gate oxide films 50. As a result of the lowering of the concentration of the p-type impurities in the regions concerned, the positions of the lower surface of the regions of the base region 30 which are brought into contact with the gate oxide films 50, become shallower than those of other regions. In such a way, as shown in FIG. 5, the lower surface of the base region 30 comes to have the curved shape protruding downward.

Note that, since wall surfaces of the trenches 55 are rough, oxidation may be performed once and thereafter, oxide films may be removed and the gate oxide films 50 may be formed. In this case, at the time when either of the oxide films is formed, the above-described phenomenon occurs.

Thereafter, the gate electrodes 60 are formed. For example, polysilicon films added with impurities are embedded in the insides of the trenches. Then, as shown in FIG. 5, by a polishing process such as chemical mechanical processing (CMP), the surface of the base region 30 is planarized, and the gate electrodes 60 are formed. Moreover, after the interlayer insulating films 70 are formed on the gate electrodes 60, the emitter electrode 80, which connects to the emitter regions 40 and the base region 30, is formed on the interlayer insulating films 70. Then, the collector electrode 90 is formed on a back surface of the collector region 10, whereby the semiconductor device 1 shown in FIG. 1 is completed.

As described above, in accordance with the method for manufacturing a semiconductor device according to the first embodiment of the present invention, the semiconductor device 1 is manufactured, in which the position of the lower surface of the base region 30 is shallower in the regions brought into contact with the gate oxide films 50 than in the region spaced apart from the gate oxide films 50. The semiconductor device 1 also has the property that the impurity concentration of the base region 30 becomes higher as the distance from the gate oxide films 50 increases. As a result, the semiconductor device 1 can be obtained in which the withstand voltage is high and the ON voltage is low and in which the occurrence of the latch-up phenomenon is suppressed.

Note that, with regard to absorption/discharge of the impurities by the gate oxide films 50 (that is, a segregation effect of the impurities), the influence of the plane orientation of the substrate can be almost ignored, and a uniform shape can be obtained. For example, in the case of forming the base region 30 having the curved surface shape protruding downward, the channel length is changed owing to a positional shift between the mask for forming the trenches 55 and the mask for forming the base region 30. Therefore, resultant variation in the ON voltage is caused in some cases. However, in accordance with the manufacturing method according to the embodiment of the present invention, the shape of the base region 30 can be made uniform, and accordingly, the variations in the ON voltage can be suppressed.

(Second Embodiment)

Figure 6:
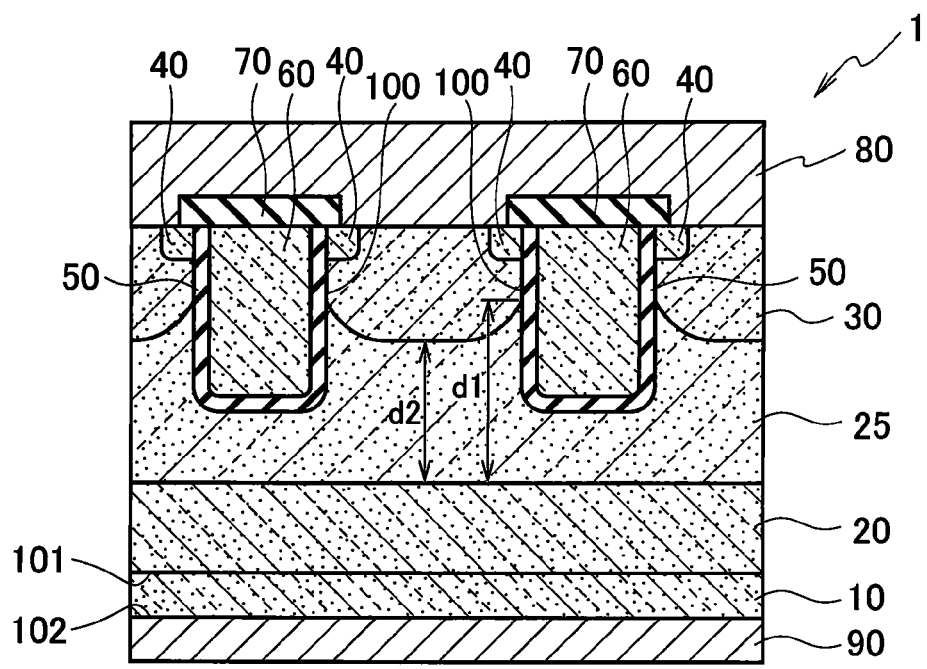
FIG. 6 is a schematic cross-sectional view showing a structure of a semiconductor device according to a second embodiment of the present invention.

As shown in FIG. 6, a semiconductor device 1 according to a second embodiment of the present invention is different from the semiconductor device 1 which is shown in FIG. 1, in further including an n-type carrier accumulation region 25 which is arranged between the drift region 20 and the base region 30 and which has a higher impurity concentration than the drift region 20.

In contrast to the base region 30, in the carrier accumulation region 25 the impurity concentration in the regions brought into contact with the gate oxide films 50 is higher in comparison with that in the regions spaced apart from the gate oxide films 50. That is to say, with regard to the carrier accumulation region 25, the impurity concentration thereof becomes lower as the distance increases from the gate oxide films 50. Incidentally, the impurity concentration of the carrier accumulation region 25 is approximately $5 \times 10^{14}$ to $5 \times 10^{16}$ cm$^{-3}$ at a spot where the impurity concentration is high.

Moreover, the position of the lower surface of the base region 30 is shallower in the regions brought into contact with the gate oxide films 50 than in the region spaced apart from the gate oxide films 50. Therefore, in the case where the lower surface of the carrier accumulation region 25 is flat, the carrier accumulation region 25 is formed so that the thickness thereof is large in the vicinities of the gate oxide films 50 and smaller in the region spaced apart from the gate oxide films 50. That is to say, when the distance from the lower surface of the carrier accumulation region 25 to the upper surface thereof is d1 in the vicinities of the gate oxide films 50 and is d2 in the regions spaced apart from the gate oxide films 50, then d1>d2 is established. Note that, as the impurity concentration of the carrier accumulation region 25 is lowered, the difference between the distance d1 and the distance d2 becomes larger.

In an IGBT having the carrier accumulation region 25, carriers accumulate in the vicinity of the interface between the carrier accumulation region 25 and the drift region 20. As the difference in impurity concentration between the carrier accumulation region 25 and the drift region 20 increases, more holes accumulate in the carrier accumulation region 25.

For example, the carrier accumulation region 25 is formed as follows. The carrier accumulation region 25 and the base region 30 are formed on the drift region 20 by the impurity diffusion method or the epitaxial growth method. For example, both the carrier accumulation region 25 and the base region 30 are formed by diffusion performed from the same upper surface of the drift region 20. Phosphorus (P) is employable as an example of impurity atoms of the carrier accumulation region 25. Subsequently, as described with reference to FIG. 3, in partial portions of the upper surface of the base region 30, the n+-type emitter regions 40 are formed, for example, by the ion implantation method and diffusion.

Subsequently, trenches, which penetrate the base region 30 and reach the carrier accumulation region 25, are formed. Then, as described with reference to FIG. 4, the gate oxide films 50 are formed on the inner walls of such trenches 55. At the same time, when the p-type impurities in the regions in the base region 30 which are brought into contact with the gate oxide films 50 are taken into the gate oxide films 50, in the carrier accumulation region 25, the n-type impurities in regions where the gate oxide films is formed are extruded into the regions brought into contact with the gate oxide films 50. Therefore, the impurity concentration becomes high in regions of the carrier accumulation region 25 which are in the vicinities of the gate oxide films 50. In the carrier accumulation region 25, the n-type impurities of the area in contact with the gate oxide films 50 are extruded to the area spaced apart from the gate oxide films 50. That is to say, with regard to the carrier accumulation region 25, the impurity concentration thereof is higher in regions close to the gate oxide films 50 than in regions spaced apart from the gate oxide films 50.

Note that the carrier accumulation region 25 may be formed either by implanting impurities from the same surface as the base region 30 or by using the epitaxial growth method after the implantation of the impurities as in the formation of the embedded layers. FIG. 6 shows an example where the lower surface of the carrier accumulation region 25 is located below the bottom portions of the trenches.

The shape of the trenches 55 may be set such that the sidewalls do not follow the crystal axis of the substrate. For example, the sidewalls of the trenches 55 may be allowed to diverge from the crystal axis of the substrate by widening or narrowing as the depth increases. The sidewalls of the trenches 55 are allowed to diverge from a specific crystal axis of the substrate, whereby strength of the substrate can be enhanced. Moreover, the n-type impurities, such as phosphorus, are uniformly extruded from the surface of the portions of the base region 30 which come into contact with the gate oxide films 50, and accordingly, the shape of the curve which forms the lower surface of the base region 30 can be changed.

Figure 7:
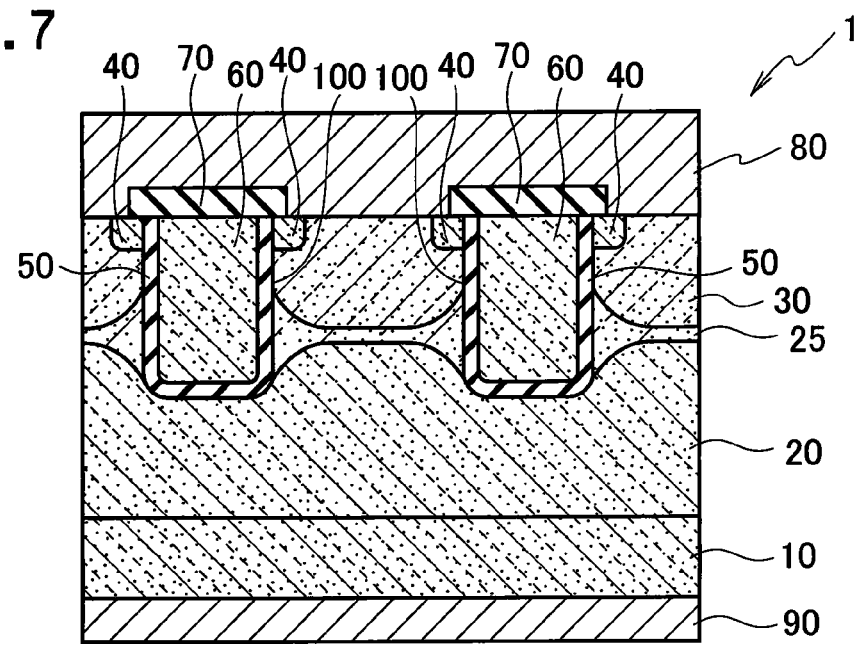
FIG. 7 is a schematic cross-sectional view showing another structure of the semiconductor device according to the second embodiment of the present invention.

As shown in FIG. 7, in the case where the lower surface of the carrier accumulation region 25 is located above the bottom portions of the trenches where the gate oxide films 50 are formed, the impurity concentration of the carrier accumulation region 25 in the vicinities of the gate oxide films 50 becomes higher than that of the region of the carrier accumulation region 25 which is spaced apart from the gate oxide films 50. Then, the cross-sectional shape of the carrier accumulation region 25 is shifted such that it dips below the trenches in the vicinities of the gate oxide films 50. That is to say, the lower surface of the carrier accumulation region 25 becomes a curved surface shape protruding downward.

In the carrier accumulation region 25, holes are likely to flow in the region where the impurity concentration is low. Therefore, the holes are relatively likely to accumulate in the vicinities of the gate oxide films 50, and the holes are likely to move between the trenches where the gate oxide films 50 are formed. That is to say, the holes move through the region spaced apart from the gate oxide films 50. Therefore, holes which move along the gate oxide films 50 and then move along the lower surfaces and side surfaces of the emitter regions 40, are reduced. In other words, the number of holes which are spaced apart from the gate oxide films 50 are increased. With regard to the holes moving along the surfaces of the emitter regions 40, the number of thereof is reduced, or the distance of the movement thereof is shorted. As a result, the occurrence of the latch-up phenomenon is suppressed.

Moreover, the thickness of the carrier accumulation region 25 in the regions brought into contact with the gate oxide films 50 is thicker than in the region of the carrier accumulation region 25 which is spaced apart from the gate oxide films 50. Therefore, the holes are more likely to move through the region which is spaced apart from the gate oxide films 50, than in the regions in contact with the gate oxide films 50. Therefore, the semiconductor device 1 can be realized in which the latch-up phenomenon is even less likely to occur.

Note that the thickness of the carrier accumulation region 25 may be uniform in the regions other than the vicinities of the gate oxide films 50. Moreover, since the carrier accumulation region 25 may be formed by the impurity diffusion method, the carrier accumulation region 25 may be formed so that a normal distribution of the impurity concentration can be established. That is to say that the impurity concentration reduces from the center of the carrier accumulation region 25 toward the peripheries thereof.

FIRST MODIFIED EXAMPLE

The carrier accumulation region 25 does not have to be formed surrounding the gate oxide films 50. That is to say, the carrier accumulation region 25 does not have to be arranged on the whole of the lower surface of the base region 30 as the active region, but for example, as shown in FIG. 8, the carrier accumulation region 25 may be arranged so as to be separated from the gate oxide films 50.

Figure 8:
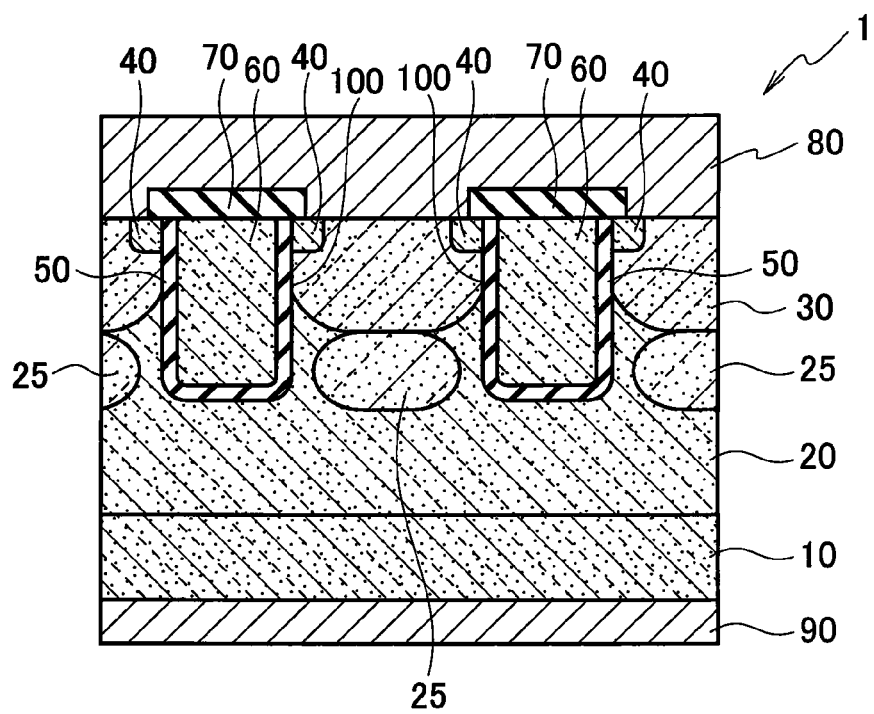
FIG. 8 is a schematic cross-sectional view showing a structure of a semiconductor device according to a first modified example of the second embodiment of the present invention.

FIG. 8 shows a structure in which plural areas of the carrier accumulation region 25 are provided only immediately under regions where the emitter electrode 80 connects to the base region 30. Although the plural pieces of the carrier accumulation region 25 are formed in the same way as the known embedded layers in FIG. 8, the carrier accumulation region 25 may be formed from the upper surface of the substrate by the impurity diffusion method in the same way as the base region 30. The carrier accumulation region 25 is provided as described above, whereby the accumulation effect of the holes in the vicinity of the interface between the accumulation region 25 and the drift region 20 is enhanced effectively. In addition, in the region sandwiched between the gate electrodes 60, regions are provided where the carrier accumulation region 25 is not present, from where the depletion layers extend. In such a way, the withstand voltage can also be ensured favorably. Furthermore, even in the semiconductor device 1 shown in FIG. 8, since the base region 30 is thin, holes move through the base region 30 in the region spaced apart from the gate oxide films 50. Therefore, occurrence of the latch-up phenomenon can be suppressed.

SECOND MODIFICATION EXAMPLE

Figure 9:
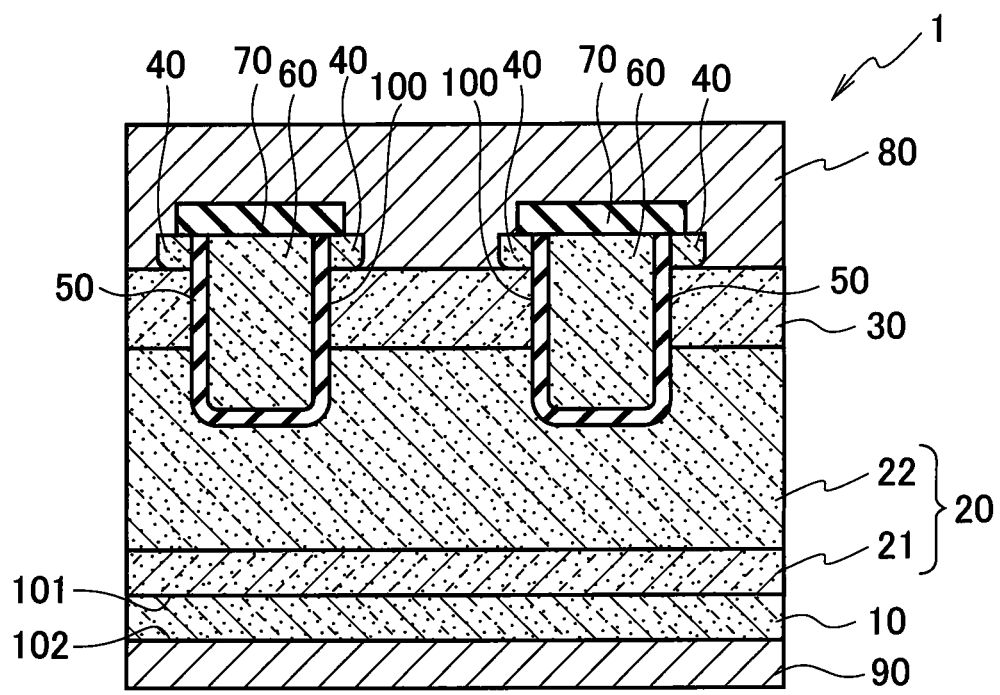
FIG. 9 is a schematic cross-sectional view showing a structure of a semiconductor device according to a second modified example of the second embodiment of the present invention.

Before the emitter electrode 80 is formed, the upper surface of the base region 30 is etched as shown in FIG. 9, and trenches may be formed, for example, so that the lower surface of the interlayer insulating film 70 and the upper surface of the base region 30 are not flush with each other. That is to say, the base region 30 is not present on the side surfaces of the emitter regions 40. The depth of the trenches in this case can be, as a reference, the surface retreated by the etching, and unetched regions can be, as a reference, an extended line of the surface concerned.

(Other Embodiments)

In the previous description of the embodiments, there are illustrated examples where the lower surface of the base region 30 and the upper surface of the carrier accumulation region 25 are brought into contact with each other. However, the base region 30 and the carrier accumulation region 25 may be arranged vertically apart from each other. For example, a p-type semiconductor region with approximately the same impurity concentration as that of the drift region 20 may be arranged between the base region 30 and the carrier accumulation region 25. However, from a viewpoint of enhancing the withstand voltage, it is preferable that the carrier accumulation region 25 be brought into contact with the base region 30.

Note that, at a position which is between the gate oxide films 50 and which is spaced apart from the gate oxide films 50, a p-type semiconductor region, in which the lower surface is deeper than the base region 30, may be formed. This p-type semiconductor region functions as a so-called DEEP-P region, and holes move through the p-type semiconductor region, whereby occurrence of the latch-up phenomenon can be suppressed.

Various modifications of the invention are possible for those skilled in the art, without departing from the scope thereof.

What is claimed is:

1. A semiconductor device comprising:
a p-type collector region;
an n-type drift region arranged on the collector region;
a p-type base region arranged on the drift region;
an n-type emitter region arranged on the base region;
a gate oxide film arranged on a bottom surface and side surface of a trench that extends from an upper surface of the emitter region and penetrates the emitter region and the base region;
a gate electrode embedded in an inside of the trench so as to be opposed to the base region while interposing the gate oxide film therebetween; and
an n-type carrier accumulation region having a higher impurity concentration than the drift region, the carrier accumulation region arranged in at least an area between the drift region and the base region, wherein
a position of a lower surface of the base region is shallower in a region brought into contact with the gate oxide film than in a region spaced apart from the gate oxide film,
the carrier accumulation region is brought into contact with the gate oxide film,
a position of an upper surface of the carrier accumulation region is shallower in the region brought into contact with the gate oxide film than in the region spaced apart from the gate oxide film, and
a position of the lower surface of the carrier accumulation region is deeper in the region brought into contact with the gate oxide film than in the region spaced apart from the gate oxide film.

2. The semiconductor device of claim 1,
wherein the bottom portion of the trench is located below a position of the lower surface of the carrier accumulation region and the lower surface being brought into contact with the gate oxide film.

3. A semiconductor device comprising:
a p-type collector region;
an n-type drift region arranged on the collector region;
a p-type base region arranged on the drift region;
an n-type emitter region arranged on the base region;
a gate oxide film arranged on a bottom surface and side surface of a trench that extends from an upper surface of the emitter region and penetrates the emitter region and the base region; and
a gate electrode embedded in an inside of the trench so as to be opposed to the base region while interposing the gate oxide film therebetween,
wherein the semiconductor device has an area where an impurity concentration of the base region becomes higher as a distance from the gate oxide film becomes greater along a vertical direction in a film thickness direction.

4. The semiconductor device of claim 3, further comprising:
an n-type carrier accumulation region having a higher impurity concentration than the drift region, the carrier accumulation region being arranged in at least an area between the drift region and the base region,
wherein the semiconductor device has an area where the impurity concentration of the carrier accumulation layer becomes lower as a distance from the gate oxide film becomes greater.

5. A method for manufacturing a semiconductor device, comprising:
forming a p-type base region on an n-type drift region by an impurity diffusion method or an epitaxial growth method;
forming an n-type emitter region on the base region;
forming a trench that extends from an upper surface of the emitter region and penetrates the emitter region and the base region;
oxidizing an inner wall of the trench and forming a gate oxide film, thereby taking, into the gate oxide film, p-type impurities from an area of the base region in contact with the gate oxide film, and thereby making a position of a lower surface of the area of the base region in contact with the gate oxide film shallower than other areas; and
forming a gate electrode by filling an inside of the trench with a material of the gate electrode.

6. The method of claim 5, further comprising:
before forming the base region, forming an n-type carrier accumulation region on the drift region by the impurity diffusion method or the epitaxial growth method, the carrier accumulation region having a higher impurity concentration than the drift region,
wherein the trench is formed so that a position of a bottom portion of the trench can be deeper than an upper surface of the carrier accumulation region.

7. The method of claim 6,
wherein the trench is formed so as to reach the carrier accumulation region, and an inner wall of the trench is oxidized and a gate oxide film is formed, whereby n-type impurities from an area of the carrier accumulation region in contact with the gate oxide film, are extruded to an area of the carrier accumulation region spaced apart from the gate oxide film, and a position of an upper surface of the area of the base region in contact with the gate oxide film is made shallower than other areas.

* * * * *